(12) United States Patent
Koyama et al.

(10) Patent No.: US 8,008,667 B2
(45) Date of Patent: Aug. 30, 2011

(54) SEMICONDUCTOR DEVICE INCLUDING A TRANSPARENT SEMICONDUCTOR LAYER FOR VIEWING AN UNDERLYING TRANSISTOR IN A SEMICONDUCTOR SUBSTRATE

(75) Inventors: Hidetoshi Koyama, Tokyo (JP); Yoshitaka Kamo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 225 days.

(21) Appl. No.: 11/955,672

(22) Filed: Dec. 13, 2007

(65) Prior Publication Data
US 2009/0014728 A1 Jan. 15, 2009

(30) Foreign Application Priority Data
Jul. 11, 2007 (JP) ................................ 2007-181806

(51) Int. Cl.
*H01L 29/04* (2006.01)
*H01L 29/15* (2006.01)
*H01L 31/036* (2006.01)

(52) U.S. Cl. ................. 257/74; 257/76; 257/77; 257/80; 257/338; 257/E21.209; 257/E21.614; 257/E23.085; 257/E25.006; 257/E25.013; 257/E25.017; 257/E25.027; 257/E27.026; 257/E27.027; 257/E27.028; 257/E27.029; 257/E29.068; 438/152

(58) Field of Classification Search .............. 257/76, 257/338, E25.017, 80, 77, E25.006, E25.013, 257/E25.027, E23.085, E21.209, E21.614, 257/E27.026, E27.027, E27.028, E27.029, 257/E29.068, 74; 438/152
See application file for complete search history.

(56) References Cited

U.S. PATENT DOCUMENTS

| 5,525,536 | A | 6/1996 | Ueda |
| 6,713,785 | B2 | 3/2004 | Yagi |
| 6,727,522 | B1 | 4/2004 | Kawasaki et al. |
| 6,943,067 | B2 * | 9/2005 | Greenlaw ...................... 438/152 |
| 2003/0006415 | A1 * | 1/2003 | Yokogawa et al. ............. 257/77 |
| 2003/0209185 | A1 * | 11/2003 | Ueno et al. ........................ 117/2 |
| 2005/0121793 | A1 * | 6/2005 | Liaw ............................. 257/758 |
| 2005/0224809 | A1 * | 10/2005 | Sriram ........................... 257/77 |
| 2006/0115944 | A1 | 6/2006 | Kwak et al. |
| 2006/0284247 | A1 * | 12/2006 | Augustine et al. ............. 257/338 |
| 2006/0292880 | A1 * | 12/2006 | Son et al. ...................... 438/705 |
| 2007/0102727 | A1 * | 5/2007 | Twynam ....................... 257/194 |

FOREIGN PATENT DOCUMENTS

| JP | 64-50444 | A | | 2/1989 |
| JP | 02253622 | A | * | 10/1990 |
| JP | 5-75018 | | | 3/1993 |
| JP | 2000-150900 | | | 5/2000 |
| JP | 2003-179233 | | | 6/2003 |
| JP | 2006-203250 | | | 8/2006 |

OTHER PUBLICATIONS

English Abstract of JP 02253622A.*

* cited by examiner

*Primary Examiner* — Matthew E Warren
*Assistant Examiner* — David Chen
(74) *Attorney, Agent, or Firm* — Leydig, Voit & Mayer, Ltd.

(57) ABSTRACT

A semiconductor device includes a first semiconductor layer and a first semiconductor element located in the first semiconductor layer. The semiconductor device also includes a second semiconductor layer of a transparent semiconductor material. The second semiconductor layer is disposed on the first semiconductor layer covering the first semiconductor element. The semiconductor device also includes a second semiconductor element located in the second semiconductor layer. The semiconductor device also includes a wire extending within the second semiconductor layer and electrically connecting the first and second semiconductor elements.

8 Claims, 1 Drawing Sheet

SEMICONDUCTOR DEVICE INCLUDING A TRANSPARENT SEMICONDUCTOR LAYER FOR VIEWING AN UNDERLYING TRANSISTOR IN A SEMICONDUCTOR SUBSTRATE

FIELD OF THE INVENTION

The present invention relates to a semiconductor device.

BACKGROUND ART

Three-dimensional semiconductor devices (or semiconductor devices with a three-dimensional structure) formed of an Si (silicon) semiconductor material have been known in the art, as disclosed in JP-A-2006-203250. According to the technique disclosed in this patent publication, a three-dimensional semiconductor device is manufactured by the following steps: forming a semiconductor integrated circuit on a semiconductor substrate; forming an interlayer film over the substrate; forming an Si layer on the interlayer film; and forming another semiconductor integrated circuit on the Si layer. (Other prior art includes JP-A No. Hei 5-75018, 2000-150900, and 2003-179233.)

In manufacture of a three-dimensional semiconductor device, it is preferable that each semiconductor element formed in each semiconductor layer be accurately disposed at a desired location. It should be noted that the more semiconductor layers are formed, the more necessary it is to accurately determine and establish the positional relationship between the structures (or semiconductor elements) formed in these layers.

However, the above conventional method of forming a three-dimensional device structure first forms semiconductor elements on a semiconductor substrate and then forms an Si layer over the substrate, as described above. This means that the structure fabricated on the substrate is covered with the formed Si layer, thereby preventing accurate measurement of the position of the structure. As a result, it is difficult to accurately determine and establish the positional relationship between the structures formed in the semiconductor layers of the semiconductor device.

To circumvent this problem, after the step of fabricating semiconductor elements in the Si layer (formed on the substrate), the portions of the Si layer not forming these elements may be removed by a patterning technique to allow the semiconductor elements on the substrate to be viewed. However, this requires an additional process step(s).

SUMMARY OF THE INVENTION

The present invention has been devised to solve the above problems. It is, therefore, an object of the present invention to provide a three-dimensional semiconductor device that can be manufactured while accurately determining and establishing the positional relationship between the semiconductor elements formed in its semiconductor layers without increasing the complexity of the manufacturing process.

According to one aspect of the present invention, a semiconductor device includes a first semiconductor layer and a first semiconductor element formed in the first semiconductor layer. The semiconductor device also includes a second semiconductor layer of a transparent semiconductor material. The second semiconductor layer is formed on the first semiconductor layer so as to cover the first semiconductor element. The semiconductor device also includes a second semiconductor element formed in the second semiconductor layer.

The semiconductor device also includes a wire extending within the second semiconductor layer to electrically connect between the first and second semiconductor elements.

Other and further objects, features and advantages of the invention will appear more fully from the following description.

DETAILED DESCRIPTION OF THE PREFERRED EMBODIMENTS

First Embodiment

Figure 1:
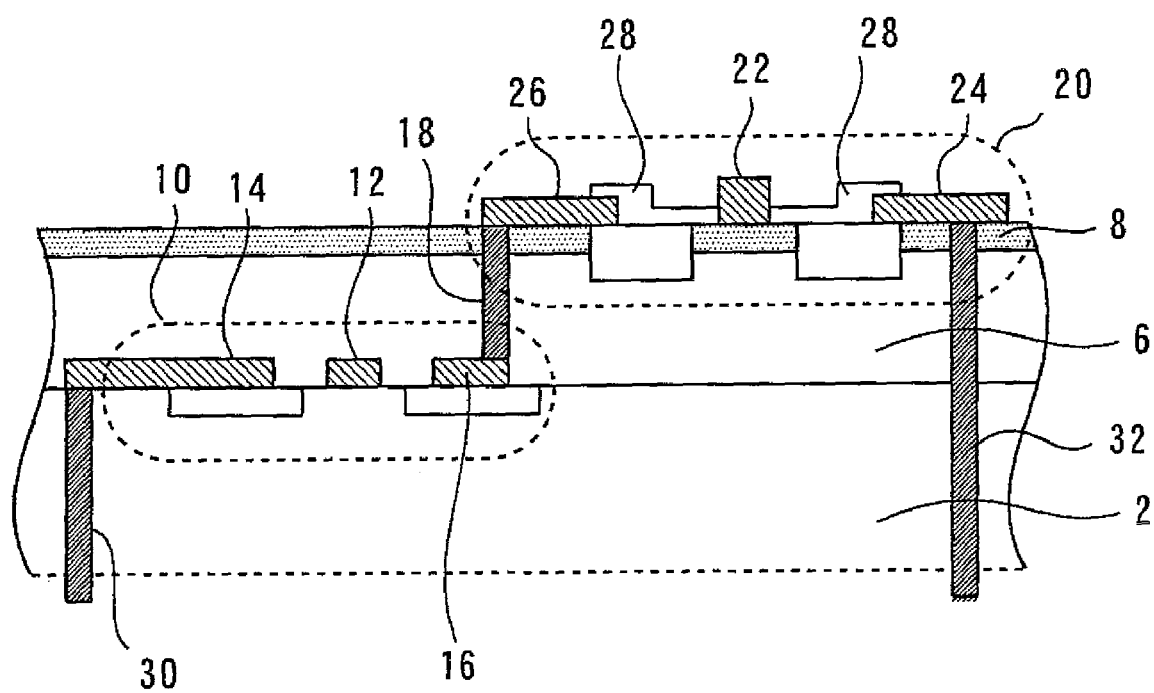
FIG. 1 is a cross-sectional view of a semiconductor device according to a first embodiment of the present invention.

FIG. 1 is a cross-sectional view of a semiconductor device according to a first embodiment of the present invention. This semiconductor device is assumed to be a high frequency semiconductor device and includes an SiC (silicon carbide) substrate 2 (a transparent substrate), as shown in FIG. 1. Referring to FIG. 1, a transistor 10 is formed in the SiC substrate 2. The transistor 10 has a gate electrode 12, a source electrode 14, and a drain electrode 16.

A GaN (gallium nitride) layer 6, which is a transparent single crystal semiconductor layer, is formed to cover the transistor 10. Further, an AlGaN layer 8 is formed over the GaN layer 6, and a transistor 20 is formed in the AlGaN layer 8. The transistor 20 has a gate electrode 22, a source electrode 24, and a drain electrode 26. An insulating film 28 is formed around the gate electrode 22.

The semiconductor device of the present embodiment includes a wire 18 electrically connected between the drain electrode 16 of the transistor 10 and the drain electrode 26 of the transistor 20. This wire penetrates into the GaN layer 6 to reach the drain electrode 16 of the transistor 10. The semiconductor device also includes a wire 30 connected to the source electrode 14 of the transistor 10 and a wire 32 connected to the source electrode 24 of the transistor 20. The wire 30 penetrates through the SiC substrate 2, and the wire 32 penetrates through the AlGaN layer 8, the GaN layer 6, and the SiC substrate 2.

Thus, the semiconductor device of the present embodiment has a three-dimensional multilayer structure including the SiC substrate 2, the GaN layer 6, and the AlGaN layer 8. The transistor 10 is formed in the SiC substrate 2, and the transistor 20 is formed in the GaN layer 6 and the AlGaN layer 8.

This semiconductor device can be manufactured, for example, by the following process. First, the SiC substrate 2 (a transparent substrate) is provided. The wire 30, a portion of the wire 32, and the transistor 10 are then formed in the SiC substrate 2. Next, the GaN layer 6 is grown on the SiC substrate 2, and the wire 18 and the remaining portion of the wire 32 are formed in the GaN layer 6. The transistor 20 is then formed to be electrically connected to the wires 18 and 32.

It should be noted that in the case of a high frequency device formed of GaN, the GaN preferably has a hexagonal crystalline structure. Therefore, according to the present embodiment, the portion of the SiC substrate 2 underlying the GaN layer 6 is formed to have a crystalline plane or crystalline structure that allows the GaN layer 6 to have a hexagonal crystalline structure.

It should be further noted that, as used in the description of the present embodiment, the term "transparent" refers to the ability to transmit (or substantially not to absorb) the laser beam for wafer position detection emitted by the existing exposure apparatus used in the manufacture of the semiconductor device. Specifically, a "transparent" semiconductor material in accordance with the present embodiment may have transparency to light of visible wavelengths. Examples of such "transparent" semiconductor materials that have an energy gap of 2.5 eV or more and that can be used to form a semiconductor device include SiC, GaN, ZnO (zinc oxide), etc.

In the description of the present embodiment, the term "energy gap" is synonymously used with the terms "bandgap" and "forbidden bandwidth." That is, the term "energy gap" may be replaced by the term "bandgap."

The following should be noted: the SiC substrate 2 is referred to in the "Summary of the Invention" section and the appended claims as a "first semiconductor layer"; the transistor 10, a "first semiconductor element"; the GaN layer 6 and the AlGaN layer 8 together, a "second semiconductor layer"; the transistor 20, a "second semiconductor element"; and the wire 18, a "wire."

The advantages of the above semiconductor device of the present embodiment will now be described.

According to the present embodiment, since the GaN semiconductor layer 6 formed on the SiC substrate 2 is made of a transparent semiconductor material, the position of the transistor 10 can be optically detected by viewing through the GaN layer 6. This allows the semiconductor device to be manufactured while accurately determining and establishing the positional relationship between the transistors 10 and 20.

More specifically, the wafer position detecting mechanism of existing exposure apparatus used in the manufacture of the semiconductor device can be used to readily detect the position of the transistor 10 formed in the SiC substrate 2. This allows accurate positioning of the transistor 20 relative to the transistor 10. Further, the choice of the transparent semiconductor material may be determined by the wavelength of the laser beam emitted by an existing optical system (e.g., the laser apparatus for wafer position detection in the exposure apparatus), which allows manufacture of the three-dimensional semiconductor device without significantly changing the optical system.

The substrate (the SiC substrate 2) of the semiconductor device of the present embodiment is formed of SiC. Since SiC is transparent, the position of the transistor 10 can also be detected by viewing from the opposite side (the lower side as viewed in FIG. 1) of the substrate to the transistor 10.

It should be noted that transparent semiconductor materials having an energy gap (or bandgap) of 2.5 eV or more, such as GaN, usually has a semi-insulating property. That is, in the present embodiment, the GaN layer 6 (which is semi-insulating) interposed between the transistors 10 and 20 provides good insulation between these transistors. As a result, this three-dimensional semiconductor device has both a light transmitting property and an electrical insulating property. Further, insulating films (or interlayer insulating films), not shown in FIG. 1, for insulating the transistors 10 and 20 can be omitted from the device without a significant reduction in insulation, thereby allowing simplification of the structure of the semiconductor device and hence simplification of the manufacture thereof.

In the manufacture of the three-dimensional semiconductor device of the present embodiment, the GaN layer 6 and other layers are successively stacked over the SiC substrate 2. Therefore, each stacked semiconductor layer preferably has high crystalline quality.

One method for achieving this is to form an amorphous or polycrystalline semiconductor layer on the semiconductor substrate and then recrystallize the formed semiconductor layer. However, this requires an additional process step(s) including a recrystallization step, resulting in increased manufacturing time.

On the other hand, according to the present embodiment, the semiconductor layers successively stacked over the substrate are grown in crystal form, thereby simplifying the manufacturing process. Especially, the transparent semiconductor layer (the GaN layer 6) formed on the SiC substrate 2 is made of GaN having a lattice constant close to that of SiC, which allows the layer to be epitaxially grown on the SiC substrate 2. That is, the GaN layer 6 can be formed to be a single semiconductor crystal layer having high quality, thus eliminating the need for a complicated recrystallization process.

Thus, in the semiconductor device of the present embodiment, the entire portion of the GaN layer 6 is highly crystallized since the layer is epitaxially grown. This allows the transistor 20 to be formed at any desired location, resulting in greater design freedom.

A semiconductor device of GaN or SiC material is usually manufactured at temperatures of 1000° C. or higher. It should be noted that the heat treatment temperature of the substrate affects the quality of the crystal formed by the epitaxial growth process. That is, the higher the heat treatment temperature, the better. Since the semiconductor device of the present embodiment is formed of GaN and SiC, it can be manufactured under elevated temperature conditions (at 1000° C. or higher, as described above) to increase the crystalline quality of its semiconductor layers.

On the other hand, in the case of a three-dimensional semiconductor device primarily formed of Si (such as that disclosed in JP-A-2006-203250 noted above), for example, there is a relatively low upper limit to the heat treatment temperature of the substrate. The above publication mentions that the maximum allowable heat treatment temperature is approximately 900° C. The reason for this is that in the case of a three-dimensional semiconductor device primarily made of Si material, the semiconductor element(s) formed on the substrate degrades in performance when subjected to elevated temperature conditions.

In the case of the three-dimensional semiconductor device of the present embodiment, on the other hand, the SiC substrate 2 and the transistor 10 do not suffer any degradation even if the substrate is heat treated at 900° C. or higher. That is, the device structure of the present embodiment has higher heat resistance than the device structure of the above patent publication.

Thus, the three-dimensional semiconductor device of the present embodiment includes a transparent substrate and an overlying transparent semiconductor layer made of SiC and GaN, respectively, which enables the device to achieve many advantages such as accurate positioning of its transistors (or semiconductor elements), good insulation between these transistors, etc., high heat resistance, high crystalline quality in its semiconductor layers, and simplification of its manufacturing process. These advantages are especially beneficial since the semiconductor device has a three-dimensional structure. That is, the device structure of the present embodiment provides various advantages described above, in addition to accurate positioning of its transistors.

It should be noted that although in the present embodiment SiC and GaN are used to form the transparent substrate and the overlying transparent semiconductor layer, respectively, to achieve advantages as described above, in other embodiments other materials may be used to attain such advantages. Specifically, the transparent substrate and the overlying transparent layer may be formed of any one of SiC, GaN, and ZnO.

For example, in the three-dimensional semiconductor device of the present embodiment, the SiC substrate 2 (underlying the GaN layer 6) may be replaced by a GaN substrate.

Variations of the first embodiment will now be described.

As described above, the three-dimensional semiconductor device of the first embodiment includes a transparent substrate and an overlying transparent semiconductor layer made of Sic and GaN, respectively, to achieve accurate positioning of its transistors (a primary advantage) and achieve many other advantages (secondary advantages). However, the present invention is not limited to this particular arrangement.

For example, if the semiconductor device need not achieve the secondary advantages (such as good insulation between its transistors, etc., high heat resistance, high crystalline quality in its semiconductor layers, and simplification of its manufacturing process), a wide variety of transparent materials can be used to form the substrate and the overlying semiconductor layer to achieve the primary advantage of accurate positioning of the transistors.

It should be noted that as used in the description of the present embodiment, the term "transparent" refers to the ability to transmit (or substantially not to absorb) the laser beam for wafer position detection emitted by the existing exposure apparatus used in the manufacture of the semiconductor device, as described above. That is, semiconductor materials having such a transparent property can be used to achieve accurate positioning of the transistors.

Further, although in the first embodiment the substrate is made of SiC (and referred to as the SiC substrate 2), it may be formed of other material. For example, the substrate may be made of a nontransparent semiconductor material (e.g., Si) if it is not necessary to allow viewing from the bottom side of the substrate. In this case, the structure fabricated on the substrate is optically detected through the transparent semiconductor layer formed on the substrate.

Further, the substrate may be formed of a transparent material, and an SiC layer serving as a base layer may be formed on the substrate. In this case, the GaN layer is formed on the SiC layer. The SiC layer (serving as a base layer and formed on the transparent substrate) and the overlying GaN layer are also referred to in the "Summary of the Invention" section and the appended claims as a "first semiconductor layer" and a "second semiconductor layer," respectively.

The three-dimensional semiconductor device of the first embodiment is constructed to achieve the primary advantage of accurate positioning of its transistors and achieve secondary advantages such as: (i) good insulation between its transistors, etc., (ii) simplification of the manufacturing process, (iii) high crystalline quality in its semiconductor layers, and (iv) high heat resistance. However, the present invention is not limited to this particular construction. That is, the present invention can provide a three-dimensional semiconductor device having a different construction or formed of different material while allowing accurate positioning of its transistors in the manufacture of the device, if it is not necessary to achieve one or more of the above secondary advantages.

For example, if the three-dimensional semiconductor device is only required to achieve (i) good insulation between its transistors, etc. in addition to the primary advantage (i.e., accurate positioning of its transistors), then various transparent semiconductor materials having an energy gap (or bandgap) of 2.5 eV or more can be used, and an interlayer insulating film(s) may be omitted from the three-dimensional semiconductor device.

Further, if the three-dimensional semiconductor device is only required to achieve (ii) simplification of its manufacturing process and (iii) high crystalline quality in its semiconductor layers in addition to the above primary advantage (i.e., accurate positioning of its transistors), then transparent semiconductor materials even other than SiC and GaN (regardless of their energy gap) can be used to grow the transparent semiconductor layer on the substrate. Especially, the material of the transparent semiconductor layer may be selected to have a lattice constant close to that of the material of the substrate, which enables the layer to be epitaxially grown on the substrate, thus allowing the three-dimensional semiconductor device to have high crystalline quality.

Further, if the three-dimensional semiconductor device is only required to achieve (iv) high heat resistance in addition to the primary advantage (i.e., accurate positioning of its transistors), then transparent semiconductor materials even other than SiC and GaN used at high temperature in a common manufacturing process can be used to form the substrate and the overlying semiconductor layer.

Although in the present embodiment the semiconductor layer (the GaN layer 6) formed on the SiC substrate 2 has a hexagonal crystalline structure, it may have a different crystalline structure determined by the type and use of the semiconductor device.

Although in the present embodiment the transistor 20 is formed after the formation of the wire 18, it may be formed before the wire 18. This allows the transistor 20 to be disposed at any desired location, thus providing greater manufacturing freedom.

Further, in the three-dimensional semiconductor device, a plurality of semiconductor layers may be successively stacked over the SiC substrate 2. In this case, these semiconductor layers may be formed of a transparent material to readily and accurately align the structures (or transistors) formed in the layers.

It should be noted that in the three-dimensional semiconductor device of the present embodiment, transistors (10, 20) are formed in the substrate SiC 2 and the overlying GaN layer 6 and AlGaN layer 8. In other embodiments, however, other semiconductor elements may be formed in the substrate and overlying semiconductor layers.

Further, the three-dimensional structure of the semiconductor device of the present embodiment provides greater freedom in material selection than the three-dimensional structure of the semiconductor device primarily formed of Si disclosed in JP-A-2006-203250 noted above.

The features and advantages of the present invention may be summarized as follows: according to the first aspect of the present invention, since the second semiconductor layer covering the first semiconductor element is made of a transparent semiconductor material, the position of the first semiconductor element can be optically detected by viewing through the second semiconductor layer. This allows the semiconductor device to be manufactured while accurately determining and establishing the positional relationship between the first and second semiconductor elements without increasing the complexity of the manufacturing process.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-181806, filed on Jul. 11, 2007 including specification, claims, drawings and summary, on which the Convention priority of the present application is based, are incorporated herein by reference in its entirety.

What is claimed is:

1. A semiconductor device comprising:
a semiconductor substrate of a first semiconductor material;
a first transistor located in said semiconductor substrate;
a first semiconductor layer of a crystalline transparent second semiconductor material, different in composition from said first semiconductor material, grown directly on said semiconductor substrate and covering said first transistor;
a second transistor located in said first semiconductor layer; and
a wire extending within said first semiconductor layer and electrically connecting said first transistor to said second transistor, wherein said second semiconductor material has a bandgap energy of at least 2.5 eV.

2. The semiconductor device according to claim 1, wherein said first semiconductor material is a transparent semiconductor material.

3. The semiconductor device according to claim 1, wherein:
said semiconductor substrate is a single crystal material having a lattice constant; and
said first semiconductor layer is a single crystal material having a lattice constant close to the lattice constant of said semiconductor substrate so said first semiconductor layer is epitaxial to said semiconductor substrate.

4. A semiconductor device comprising:
a semiconductor substrate of a first semiconductor material;
a first transistor located in said semiconductor substrate;
a first semiconductor layer of a crystalline transparent second semiconductor material, different in composition from said first semiconductor material, grown directly on said semiconductor substrate, and covering said first transistor;
a second transistor located in said first semiconductor layer; and
a wire extending within said first semiconductor layer and electrically connecting said first transistor to said second transistor, wherein said semiconductor substrate and said first semiconductor layer are materials selected from the group consisting of SiC, GaN, and ZnO.

5. The semiconductor device according to claim 4, wherein:
said semiconductor substrate is a single crystal material having a lattice constant; and
said first semiconductor layer is a single crystal material having a lattice constant close to the lattice constant of said semiconductor substrate so said first semiconductor layer is epitaxial to said semiconductor substrate.

6. A semiconductor device comprising:
a semiconductor substrate of a first semiconductor material;
a first transistor located in said semiconductor substrate;
a first semiconductor layer of a transparent second semiconductor material, different in composition from said first semiconductor material, supported by said semiconductor substrate and covering said first transistor;
a second semiconductor layer interposed between said first semiconductor layer and said semiconductor substrate;
a second transistor located in said first semiconductor layer; and
a wire extending within said first semiconductor layer and electrically connecting said first transistor to said second transistor, wherein said semiconductor substrate is SiC, said first semiconductor layer is AlGaN, and said second semiconductor layer is GaN.

7. A semiconductor device comprising:
a first semiconductor layer;
a first transistor located in said first semiconductor layer and having at least one electrode;
a second semiconductor layer of a transparent semiconductor material disposed on said first semiconductor layer and covering all of the electrodes of said first transistor;
a second transistor located in said second semiconductor layer and having at least one electrode; and
a wire extending within said second semiconductor layer and electrically connecting an electrode of said first transistor to an electrode of said second transistor, wherein
the transparent semiconductor material of said second semiconductor layer has a bandgap energy of at least 2.5 eV, and
said second semiconductor layer is disposed between said first and second transistors, without any additional insulating film disposed between said first and second transistors.

8. The semiconductor device according to claim 7, wherein
said first semiconductor layer is a first semiconductor material; and
said second semiconductor layer is a second semiconductor material, different in composition from said first semiconductor material.

* * * * *